US010634566B2

(12) United States Patent
Eid et al.

(10) Patent No.: US 10,634,566 B2
(45) Date of Patent: Apr. 28, 2020

(54) PIEZOELECTRIC PACKAGE-INTEGRATED TEMPERATURE SENSING DEVICES

(71) Applicant: Intel Corporation, Santa Clara, CA (US)

(72) Inventors: Feras Eid, Chandler, AZ (US); Sasha N. Oster, Chandler, AZ (US); Georgios C. Dogiamis, Chandler, AZ (US); Thomas L. Sounart, Chandler, AZ (US); Adel A. Elsherbini, Chandler, AZ (US); Shawna M. Liff, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 789 days.

(21) Appl. No.: 15/199,907

(22) Filed: Jun. 30, 2016

(65) Prior Publication Data

US 2018/0003569 A1 Jan. 4, 2018

(51) Int. Cl.
| | |
|---|---|
| *G01K 11/22* | (2006.01) |
| *G01K 1/00* | (2006.01) |
| *G01K 11/26* | (2006.01) |
| *H01L 41/113* | (2006.01) |
| *H01L 41/047* | (2006.01) |
| *H01L 41/09* | (2006.01) |

(52) U.S. Cl.
CPC ............ *G01K 11/26* (2013.01); *H01L 41/047* (2013.01); *H01L 41/09* (2013.01); *H01L 41/1132* (2013.01)

(58) Field of Classification Search
USPC ................................. 374/117, 208; 327/512
See application file for complete search history.

(56) References Cited

U.S. PATENT DOCUMENTS

| | | | |
|---|---|---|---|
| 6,331,074 B1 * | 12/2001 | Kimura | G01N 5/04 219/209 |
| 8,827,550 B2 * | 9/2014 | Abdelmoneum | G01K 7/32 374/117 |
| 2008/0011091 A1 | 1/2008 | Weldon, Jr. | |
| 2009/0268776 A1 | 10/2009 | Koyama | |
| 2010/0186515 A1 | 7/2010 | Sakurai et al. | |
| 2012/0266675 A1 | 10/2012 | Huffman et al. | |

(Continued)

OTHER PUBLICATIONS

International Search Report and Written Opinion from PCT/US2017/033383 dated Aug. 21, 2017, 14 pgs.

(Continued)

*Primary Examiner* — Mirellys Jagan
(74) *Attorney, Agent, or Firm* — Schwabe, Williamson & Wyatt, P.C.

(57) ABSTRACT

Embodiments of the invention include a temperature sensing device that includes a base structure that is positioned in proximity to a cavity of an organic substrate, an input transducer coupled to the base structure, and an output transducer coupled to the base structure. The input transducer includes a first piezoelectric material to generate vibrations which are transmitted on the base structure in response to input signals being applied to the input transducer. The output transducer includes a second piezoelectric material to receive the vibrations and to generate output signals which are used to determine a change in ambient temperature.

22 Claims, 9 Drawing Sheets

(56) References Cited

U.S. PATENT DOCUMENTS

2013/0160555 A1 6/2013 Buccafusca et al.
2015/0276504 A1* 10/2015 Yanata ................. G01K 1/14
374/152

OTHER PUBLICATIONS

International Preliminary Report on Patentability for International Patent Application No. PCT/US17/33383, dated Jan. 10, 2019, 11 pages.

* cited by examiner

EXCITE INPUT TRANSDUCER OF A TEMPERATURE SENSING DEVICE (E.G., TEMPERATURE SENSOR, TEMPERATURE SENSING DEVICES 130, 330, 430, 530, 630, 730, ETC.) BY APPLYING A TIME VARYING (E.G., AC) VOLTAGE BETWEEN THE INPUT ELECTRODES, WHICH CAUSES THE PIEZOELECTRIC MATERIAL BETWEEN THE ELECTRODES TO DEFORM.
802

IN RESPONSE TO THIS DEFORMATION, INDUCE VIBRATIONS IN THE BASE STRUCTURE THAT ARE TRANSMITTED TO AN OUTPUT TRANSDUCER
804

DUE TO THE PIEZOELECTRIC MATERIAL IN THE OUTPUT TRANSDUCER, THOSE TRANSMITTED VIBRATIONS GENERATE AN OUTPUT ELECTRICAL SIGNAL BETWEEN THE OUTPUT ELECTRODES OF THE OUTPUT TRANSDUCER.
806

UTILIZE A FEEDBACK LOOP (E.G., PHASE LOCKED LOOP, CONTROL CIRCUITRY) TO DETERMINE A MECHANICAL RESONANT FREQUENCY OF THE TEMPERATURE SENSING DEVICE, FOR EXAMPLE, BY APPLYING INPUT SIGNALS WITH DIFFERENT FREQUENCIES TO THE INPUT TRANSDUCER AND MONITORING OUTPUT SIGNALS OF THE OUTPUT TRANSDUCER TO DETERMINE A MAXIMUM GENERATED OUTPUT SIGNAL.
808

WHEN A LOCAL AMBIENT TEMPERATURE CHANGES, THE MECHANICAL RESONANT FREQUENCY OF THE TEMPERATURE SENSING DEVICE CHANGES BECAUSE OF INDUCED THERMOMECHANICAL STRESSES (E.G., A BEAM STRUCTURE EXPANDS OR CONTACTS IN RESPONSE TO A CHANGE IN TEMPERATURE).
810

MEASURE A CHANGE IN RESONANT FREQUENCY USING THE OUTPUT SIGNALS AND THE CHANGE IN RESONANT FREQUENCY IS USED TO DETERMINE THE CORRESPONDING TEMPERATURE CHANGE.
812

PIEZOELECTRIC PACKAGE-INTEGRATED TEMPERATURE SENSING DEVICES

FIELD OF THE INVENTION

Embodiments of the present invention relate generally to package integrated temperature sensing devices. In particular, embodiments of the present invention relate to piezoelectric package integrated temperature sensing devices (e.g., temperature sensors).

BACKGROUND OF THE INVENTION

A variety of different types of sensors are being used in portable, mobile devices and computing devices in general. Conventional approaches for temperature sensors include substrate temperature measurement techniques including resistance temperature detectors (RTDs). Those sensors tend to consume relatively large areas (~1 mm$^2$) which limits the quantity of RTDs that can be deployed, and in some cases eliminates the possibility of including any RTDs in products where form factor is very constrained. Another approach includes electromagnetic transduction which requires assembly of components such as permanent magnets to a substrate.

BRIEF DESCRIPTION OF THE DRAWINGS

FIG. 8 illustrates a method of operating a package-integrated temperature sensing device in accordance with one embodiment.

DETAILED DESCRIPTION OF THE INVENTION

Figure 1:
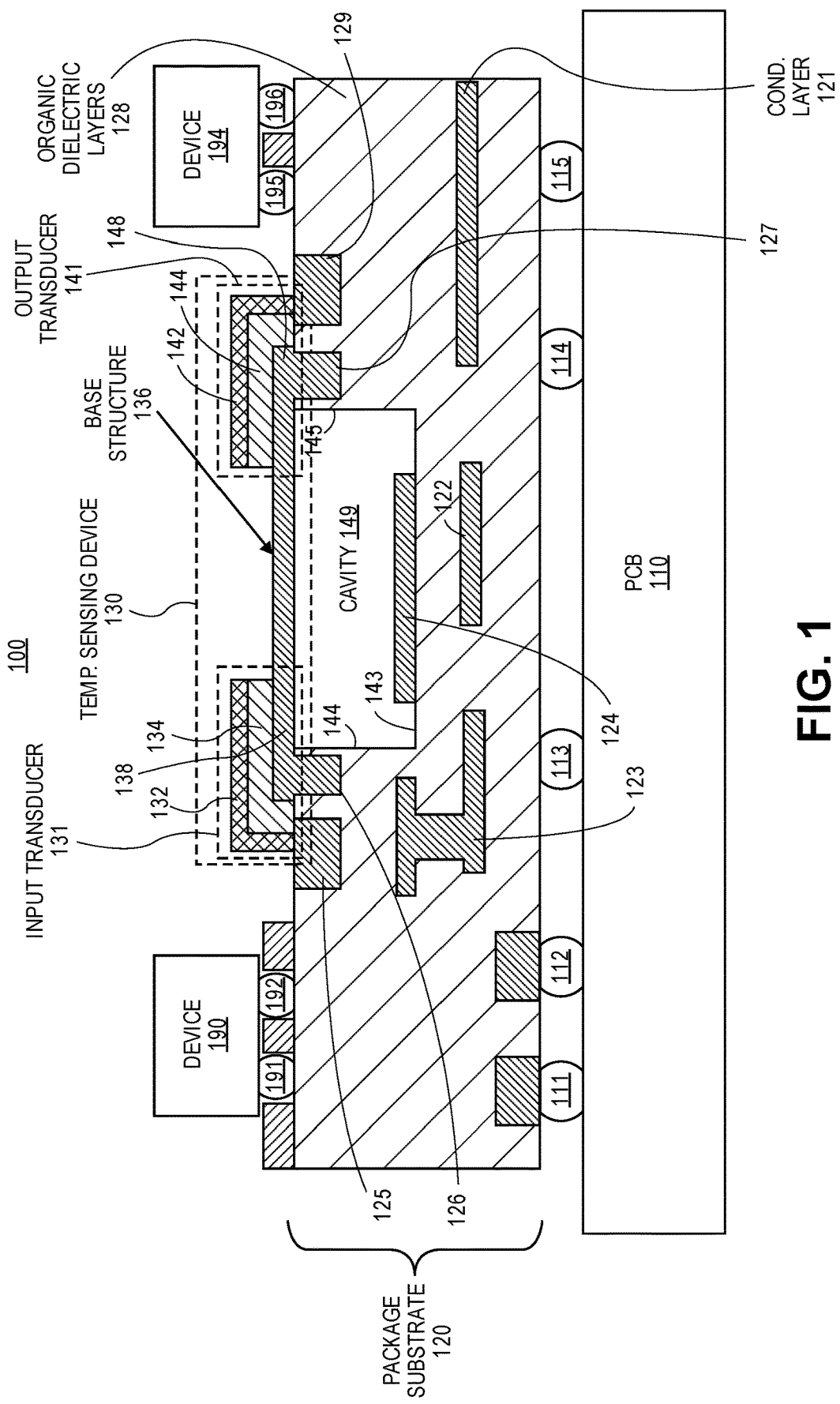
FIG. 1 illustrates a view of a microelectronic device 100 having package-integrated piezoelectric temperature sensing devices, according to an embodiment.

Described herein are piezoelectric package integrated temperature sensing devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention. However, the order of description should not be construed to imply that these operations are necessarily order dependent. In particular, these operations need not be performed in the order of presentation.

The present design includes an architecture that allows in-situ fabrication of temperature sensing devices in a compact form factor on package substrates using organic panel-level (e.g., approximately 0.5 m×0.5 m sized panels) high volume manufacturing technology, without requiring the assembly of external bulky components or expensive Si MEMS fabrication.

The present design provides thin, low cost temperature sensors that are manufactured as part of an organic package substrate traditionally used to route signals between the CPU or other die and the board. These temperature sensors can be made very compact and hence can be placed in multiple substrate locations to provide a spatial temperature map of the substrate. The sensors can be used to enhance thermal management and also for the calibration of other kinds of sensors that are temperature sensitive, such as accelerometers and gyroscopes.

In one example, the temperature sensor package has a z-axis height that is significantly less than conventional approaches. Moreover, since these temperature sensors are built using organic panel-level substrate technology, they can be manufactured more cost effectively than using a silicon-based wafer approach. The present design also eliminates the need for a magnet which is required for some electromagnetic transduction approaches for temperature sensors.

In one example, the present design includes package-integrated structures to act as temperature sensing devices. Those structures are manufactured as part of the package layers and are made free to vibrate or move by removing the dielectric material around them. The structures include piezoelectric stacks that are deposited and patterned layer-by-layer into the package. The present design includes creating temperature sensing devices in the package on the principle of suspended and vibrating structures. Etching of the dielectric material in the package occurs to create cavities. Piezoelectric material deposition (e.g., 0.5 to 1 um deposition thickness) and crystallization also occurs in the package substrate during the package fabrication process. An annealing operation at a substrate temperature range (e.g., up to 260 C) that is lower than typically used for piezoelectric material annealing allows crystallization of the piezoelectric material (e.g., lead zirconate titanate (PZT), potassium sodium niobate (KNN), aluminum nitride (AlN), zinc oxide (ZnO), etc) to occur during the package fabrication process without imparting thermal degradation or damage to the substrate layers. In one example, laser pulsed annealing occurs locally with respect to the piezoelectric material without damaging other layers of the package substrate (e.g., organic substrate) including organic layers.

Referring now to FIG. 1, a view of a microelectronic device 100 having package-integrated piezoelectric temperature sensing devices is shown, according to an embodiment. In one example, the microelectronic device 100 includes multiple devices 190 and 194 (e.g., die, chip, CPU, silicon die or chip, radio transceiver, etc.) that are coupled or attached to a package substrate 120 with solder balls 191-192, 195-196. The package substrate 120 is coupled or attached to the printed circuit board (PCB) 110 using, for example, solder balls 111 through 115.

The package substrate 120 (e.g., organic substrate) includes organic dielectric layers 128 and conductive layers 121-127, 129, 132, 136, and 142. Organic materials may include any type of organic material such as flame retardant 4 (FR4), resin-filled polymers, prepreg (e.g., pre impregnated, fiber weave impregnated with a resin bonding agent) polymers, silica-filled polymers, etc. The package substrate 120 can be formed during package substrate processing (e.g., at panel level). The panels formed can be large (e.g., having in-plane (x, y) dimensions of approximately 0.5 meter by 0.5 meter, or greater than 0.5 meter, etc.) for lower cost. A cavity 149 is formed within the packaging substrate 120 by removing one or more layers (e.g., organic layers, dielectric layers, etc.) from the packaging substrate 120. The cavity 149 includes a lower member 143 and sidewalls 144-145. In one example, a piezoelectric vibrating device 130 (e.g., temperature sensing device 130) is formed with input transducer 131, output transducer 141, and base structure 136 (e.g., beams, traces, etc.). The input transducer 131 includes a conductive structure 132, piezoelectric material 134, and a region 138 of the base structure that contacts the piezoelectric material 134. The three structures 132, 134, and 138 form a piezoelectric stack. The conductive structure 132 can act as a first electrode and the region 138 of the conductive movable base structure 136 can act as a second electrode of the input transducer. The output transducer 141 includes a conductive structure 142, piezoelectric material 144, and a region 148 of the base structure that contacts the piezoelectric material 144. The three structures 142, 144, and 148 form a piezoelectric stack. The conductive structure 142 can act as a first electrode and the region 148 of the conductive movable base structure 136 can act as a second electrode of the output transducer. The cavity 149 can be air filled or vacuum filled. The conductive base structure 136 is anchored by package connections 126 and 127 (e.g., anchors, vias) which may serve as both mechanical anchors as well as electrical connections to the rest of the package. The conductive structures 132 and 142 are anchored by package connections 125 and 129 (e.g., anchors, vias), respectively, which may serve as both mechanical anchors as well as electrical connections to the rest of the package.

The base structure 136 is released by removing the dielectric material surrounding it to allow the base structure to move. The piezoelectric material 134 and 144 are used to form two electromechanical transducers 131 and 141 that are mechanically coupled to the base structure 136. The input transducer 131 is excited by applying a time varying (e.g., AC) voltage to the piezoelectric material 134 which causes it to deform. This causes vibrations of the base structure 136 that are transmitted to the output transducer 141, generating an electrical output signal. By using a feedback loop (e.g., phase locked loop located in a main die of the package substrate, a separate die, etc.), a mechanical resonant frequency of the temperature sensing device 130 can be determined. When an ambient temperature changes, the base structure experiences induced thermomechanical stresses which change the mechanical resonant frequency of the device 130. This shift in frequency is detected in the output electrical signals of the transducer 141 and is used to correlate with an amount of temperature change.

Figure 2:
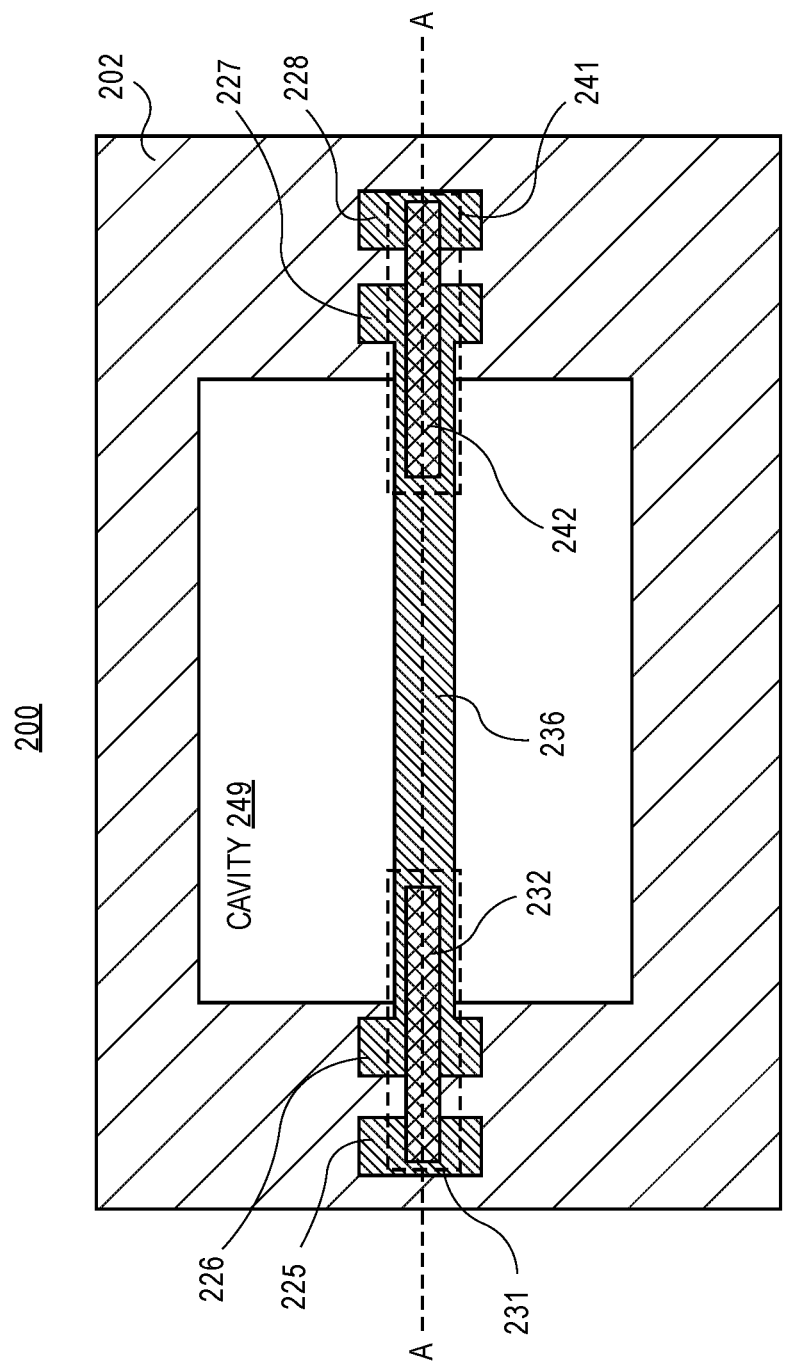
FIG. 2 illustrates a top view of a package substrate having a package-integrated piezoelectric temperature sensing device, according to an embodiment.

FIG. 2 illustrates a top view of a package substrate having a package-integrated piezoelectric temperature sensing device, according to an embodiment. In one example, the package substrate 200 may be coupled or attached to multiple devices (e.g., die, chip, CPU, silicon die or chip, RF transceiver, etc.) and may also be coupled or attached to a printed circuit board (e.g., PCB 110). The package substrate 200 (e.g., organic substrate) includes organic dielectric layers 202 and conductive layers 225-228, 232, 236, and 242. The package substrate 200 can be formed during package substrate processing (e.g., at panel level). A cavity 249 is formed within the packaging substrate 200 by removing one or more layers (e.g., organic layers, dielectric layers, etc.) from the packaging substrate 200. In one example, a piezoelectric vibrating device (e.g., temperature sensing device) is formed with input transducer 231, output transducer 241, and base structure 236 (e.g., beams, traces, etc.).

Figure 3:
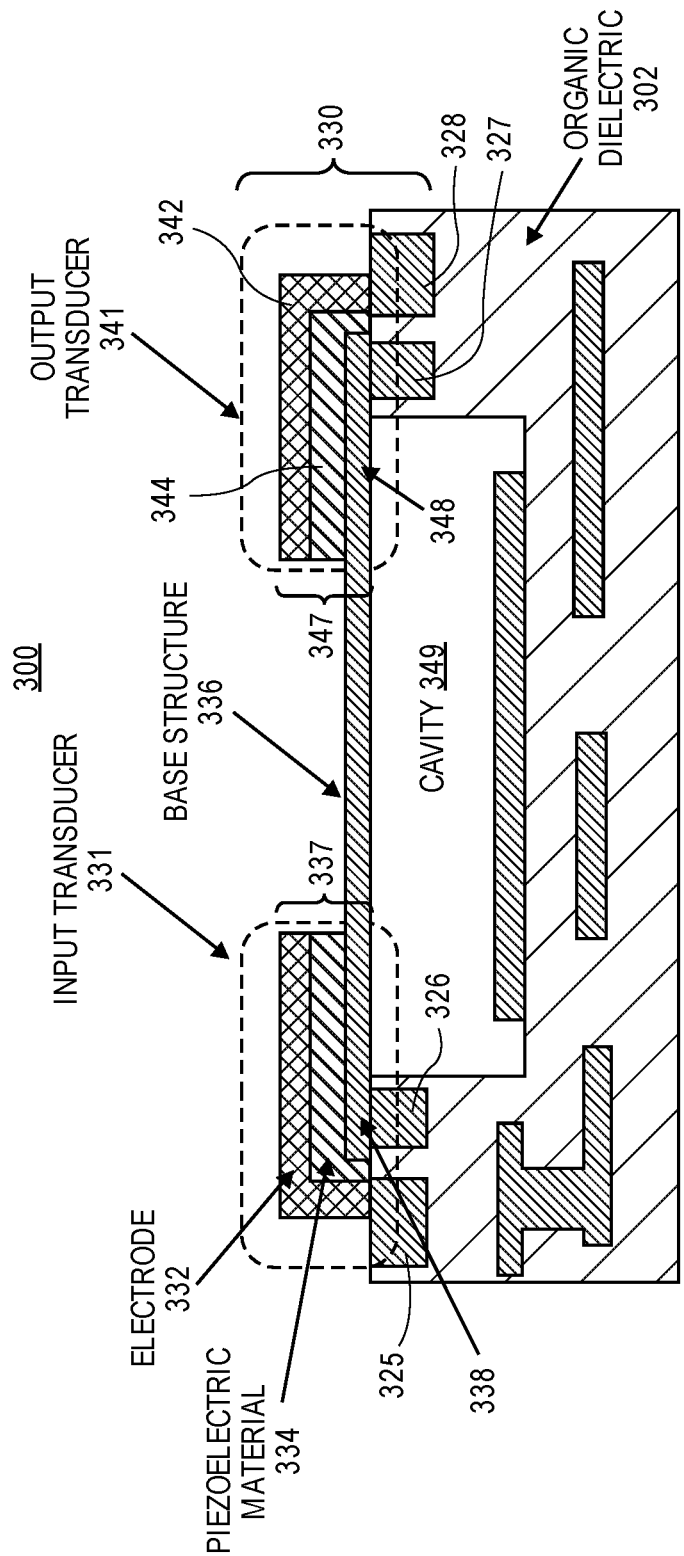
FIG. 3 illustrates a side view of a package substrate having a package-integrated piezoelectric device (e.g., temperature sensing device), according to an embodiment.

FIG. 3 illustrates a side view of a package substrate having a package-integrated piezoelectric device (e.g., temperature sensing device), according to an embodiment. The package substrate 300 (e.g., organic substrate) includes organic dielectric layers 302 (or layers 202) and conductive layers 325-328, 332, 336, and 342. The package substrate 300 can be formed during package substrate processing (e.g., at panel level). The package substrate 300 may be a cross-sectional view AA of the package substrate 200.

In one example, the package substrate 300 may be coupled or attached to multiple devices (e.g., die, chip, CPU, silicon die or chip, RF transceiver, etc.) and may also be coupled or attached to a printed circuit board (e.g., PCB 110). A cavity 349 is formed within the packaging substrate 300 by removing one or more layers (e.g., organic layers, dielectric layers, etc.) from the packaging substrate 300. In one example, a piezoelectric vibrating device 330 (e.g., temperature sensing device 330) is formed with input transducer 331, output transducer 341, and base structure 336 (e.g., beams, traces, etc.). In one example, the base structure includes a beam length of 50 um to 1 mm and a beam width of 10 to 100 um. The input transducer 331 includes a conductive structure 332, piezoelectric material 334, and a region 338 of the base structure that contacts the piezoelectric material 334. The three structures 332, 334, and 338 form a piezoelectric stack 337. The conductive structure 332 can act as a first electrode and the region 338 of the conductive movable base structure 336 can act as a second electrode of the input transducer. The output transducer 341 includes a conductive structure 342, piezoelectric material 344, and a region 348 of the base structure that contacts the piezoelectric material 344. The three structures 342, 344, and 348 form a piezoelectric stack 347. The conductive structure 342 can act as a first electrode and the region 348 of the conductive movable base structure 336 can act as a second electrode of the output transducer. The cavity 349 can be air filled or vacuum filled. The conductive base structure 336 is anchored by package connections 326 and 327 (e.g., anchors, vias) which may serve as both mechanical anchors as well as electrical connections to the rest of the package. The conductive structures 332 and 342 are anchored by package connections 325 and 328 (e.g., anchors, vias), respectively, which may serve as both mechanical anchors as well as electrical connections to the rest of the package.

Figure 4:
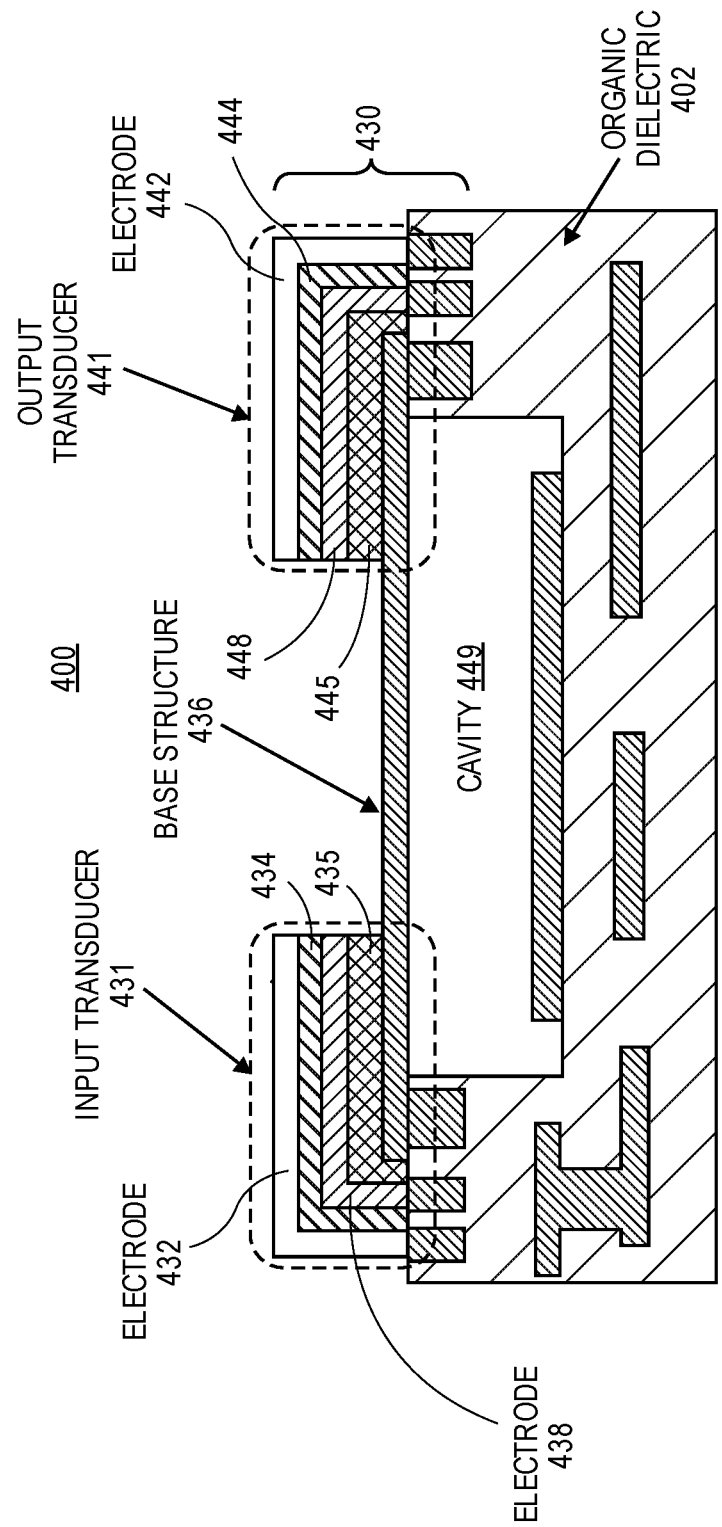
FIG. 4 illustrates a side view of a package substrate having a package-integrated piezoelectric device (e.g., temperature sensing device), according to another embodiment.

In one embodiment, the piezoelectric transducers 331 and 341 are deposited and patterned such that they are mechanically coupled to the base structure 336. Each stack 337 and 347 includes a piezoelectric material such as PZT, KNN, ZnO, or other materials sandwiched between conductive electrodes. The base structure 336 itself can be used as one of the electrodes in each stack as shown in FIG. 3, or alternatively, a separate conductive material (e.g., electrodes 438, 448) can be used for that lower electrode after depositing an insulating layer (e.g., 435, 445) to electrically decouple this lower electrode from the base structure 436 as illustrated in FIG. 4. FIG. 4 illustrates a side view of a package substrate having a package-integrated piezoelectric device (e.g., temperature sensing device), according to another embodiment. The package substrate 400 (e.g., organic substrate) includes organic dielectric layers 402 (or layers 202) and conductive layers. A cavity 449 is formed within the packaging substrate 400 by removing one or more layers (e.g., organic layers, dielectric layers, etc.) from the packaging substrate 400. In one example, a piezoelectric vibrating device 430 (e.g., temperature sensing device 430) is formed with input transducer 431, output transducer 441, and base structure 436 (e.g., beams, traces, etc.). The input transducer 431 includes a conductive structure 432, piezoelectric material 434, and a conductive structure 438 that is electrically isolated from the base structure 436 with insulating layer 435. The three structures 432, 434, and 438 form a piezoelectric stack. The conductive structure 432 can act as a first electrode and the conductive structure 438 of the conductive movable base structure 436 can act as a second electrode of the input transducer 431. The output transducer 441 includes a conductive structure 442, piezoelectric material 444, and a conductive structure 448 that is electrically isolated from the base structure 436 with insulating layer 445. The three structures 442, 444, and 448 form a piezoelectric stack. The conductive structure 442 can act as a first electrode and the conductive structure 448 of the conductive movable base structure 446 can act as a second electrode of the input transducer 441.

Although piezoelectric films typically require very high crystallization temperatures that are not compatible with organic substrates, the present design includes a process that allows the deposition and crystallization of high quality piezoelectric films without heating the organic layers to temperatures that would cause their degradation. This novel process enables the integration of piezoelectric films directly in the package substrate.

Other embodiments include using a base structure that is not a straight beam in order to attain a different range for the central frequency of the device and/or the temperature sensitivity, or to improve the reliability of the structure. Some examples of alternative embodiments are shown in FIG. 5 (meandered base) and FIG. 6 (tapered base).

Figure 5:
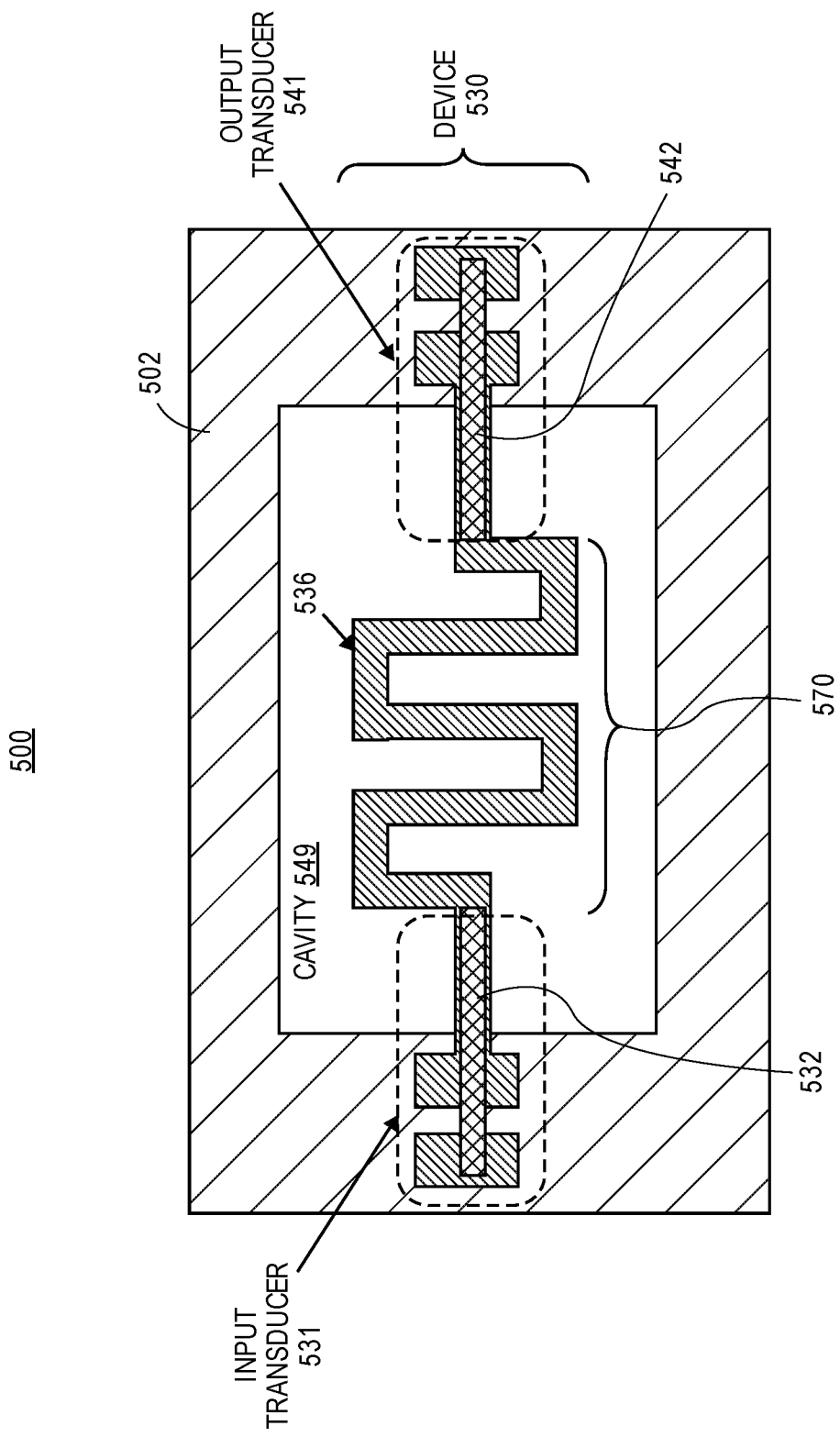
FIG. 5 illustrates a top view of a package substrate having a package-integrated piezoelectric temperature sensing device with a meandering base structure design, according to an embodiment.

FIG. 5 illustrates a top view of a package substrate having a package-integrated piezoelectric temperature sensing device with a meandered base structure design, according to an embodiment. In one example, the package substrate 500 may be coupled or attached to multiple devices (e.g., die, chip, CPU, silicon die or chip, RF transceiver, etc.) and may also be coupled or attached to a printed circuit board (e.g., PCB 110). The package substrate 500 (e.g., organic substrate) includes organic dielectric layers 502 and conductive layers 532, 536, and 542. The package substrate 500 can be formed during package substrate processing (e.g., at panel level). A cavity 549 is formed within the packaging substrate 500 by removing one or more layers (e.g., organic layers, dielectric layers, etc.) from the packaging substrate 500. In one example, a piezoelectric vibrating device 530 (e.g., temperature sensing device 530) is formed with input transducer 531, output transducer 541, and base structure 536 (e.g., beams, traces, etc.) with meandering beam portion 570 having an increased length in comparison to a straight line beam structure. The increased length of the beam structure can help improve the sensitivity of the device.

Figure 6:
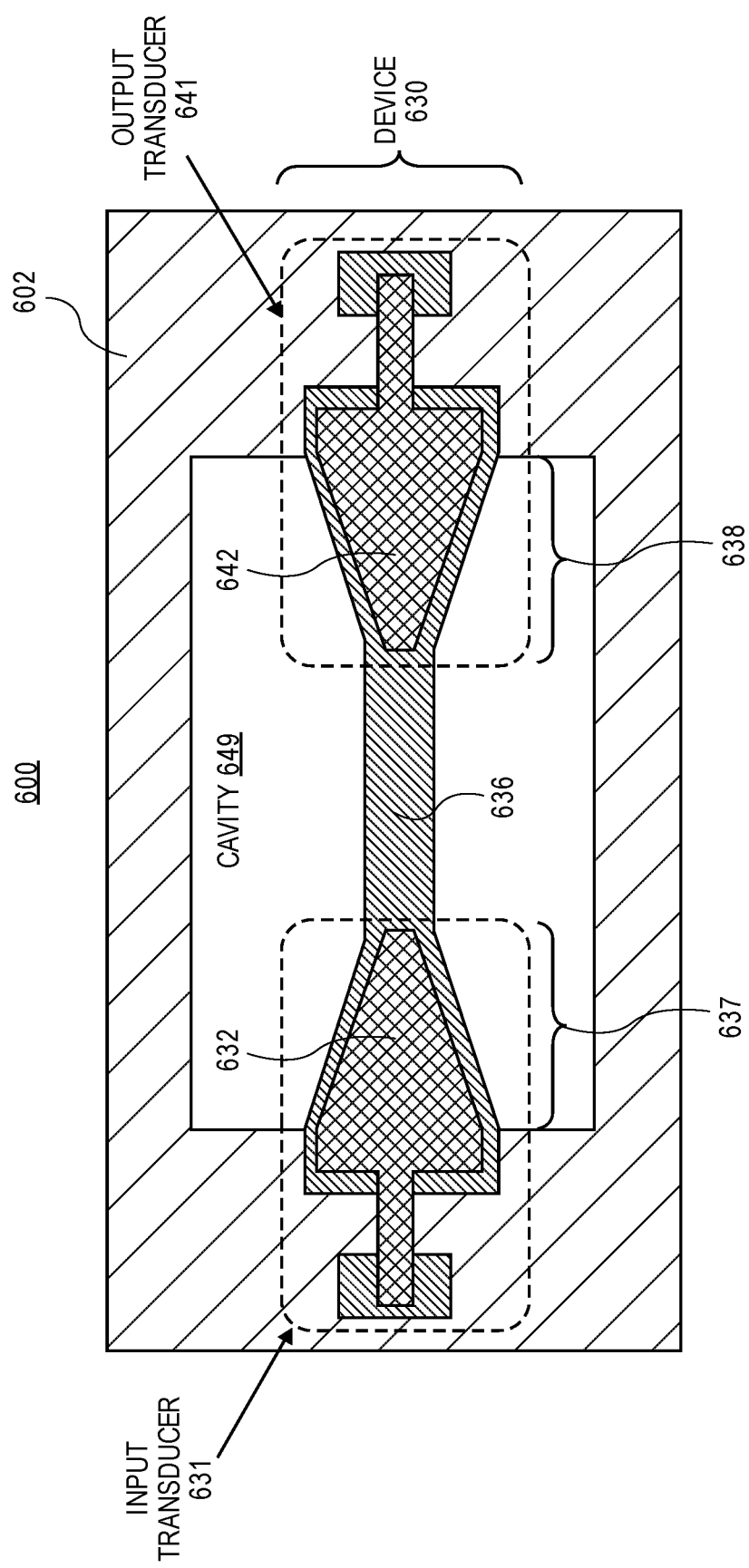
FIG. 6 illustrates a top view of a package substrate having a package-integrated piezoelectric temperature sensing device with a tapered base structure design, according to an embodiment.

FIG. 6 illustrates a top view of a package substrate having a package-integrated piezoelectric temperature sensing device with a tapered base structure design, according to an embodiment. In one example, the package substrate 600 may be coupled or attached to multiple devices (e.g., die, chip, CPU, silicon die or chip, RF transceiver, etc.) and may also be coupled or attached to a printed circuit board (e.g., PCB 110). The package substrate 600 (e.g., organic substrate) includes organic dielectric layers 602 and conductive layers 632, 636, and 642. The package substrate 600 can be formed during package substrate processing (e.g., at panel level). A cavity 649 is formed within the packaging substrate 600 by removing one or more layers (e.g., organic layers, dielectric layers, etc.) from the packaging substrate 500. In one example, a piezoelectric vibrating device 630 (e.g., temperature sensing device 630) is formed with input transducer 631, output transducer 641, and base structure 636 (e.g., beams, traces, etc.) with tapered beam portions 637 and 638.

Figure 7:
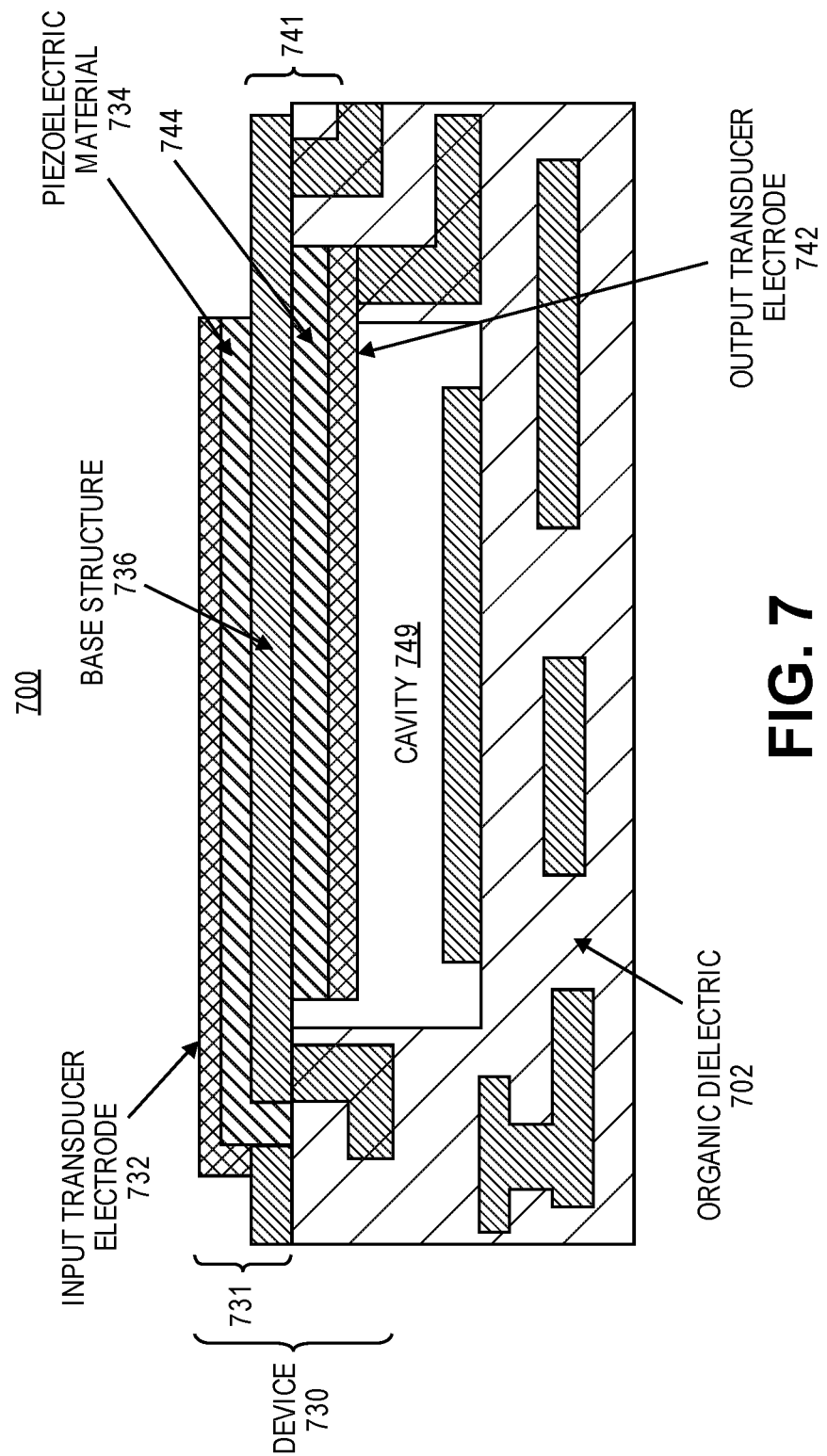
FIG. 7 illustrates a side cross-sectional view of a package substrate having a package-integrated piezoelectric temperature sensing device with a base structure being a common electrode for input and output transducers, according to an embodiment.

In an alternative embodiment, the input and output transducers can be manufactured on opposite sides of the base structure in a vertical direction, as shown in FIG. 7. FIG. 7 illustrates a side cross-sectional view of a package substrate having a package-integrated piezoelectric temperature sensing device with a base structure being a common electrode for input and output transducers, according to an embodiment. In one example, the package substrate 700 may be coupled or attached to multiple devices (e.g., die, chip, CPU, silicon die or chip, RF transceiver, etc.) and may also be coupled or attached to a printed circuit board (e.g., PCB 110). The package substrate 700 (e.g., organic substrate) includes organic dielectric layers 702 and conductive layers 732, 736, and 742. The package substrate 700 can be formed during package substrate processing (e.g., at panel level). A cavity 749 is formed within the packaging substrate 700 by removing one or more layers (e.g., organic layers, dielectric layers, etc.) from the packaging substrate 700. In one example, a piezoelectric vibrating device 730 (e.g., temperature sensing device 730) is formed with input transducer 731, output transducer 741, and base structure 736 (e.g., beams, traces, etc.) which functions as common electrode for the input and output transducers. The input transducer 731 includes an input electrode 732, a piezoelectric material 734, and common electrode 736. The output transducer 741 includes an output electrode 742, a piezoelectric material 744, and common electrode 736. In this common electrode example, a larger area of the electrodes contacts the piezoelectric material 734 and 744 in comparison to other embodiments that do not have a common electrode. Thus, the base structure can be actuated with smaller input signals.

FIG. 8 illustrates a method of operating a package-integrated temperature sensing device in accordance with one embodiment. At operation 802, a temperature sensing device (e.g., temperature sensor, temperature sensing devices 130, 330, 430, 530, 630, 730, etc.) of the present design operates initially with an input transducer being excited by applying a time varying (e.g., AC) voltage between the input electrodes, which causes the piezoelectric material between the electrodes to deform. In response to this deformation, induce vibrations in the base structure that are transmitted to an output transducer at operation 804. Due to the piezoelectric material in the output transducer, those transmitted vibrations generate an output electrical signal between the output electrodes of the output transducer at block 806. A feedback loop (e.g., phase locked loop, control circuitry) can be used to determine a mechanical resonant frequency of the temperature sensing device, for example, by applying input signals with different frequencies to the input transducer and monitoring output signals of the output transducer to determine a maximum amplitude of generated output signal at operation 808. A frequency of the input signals that corresponds to the maximum amplitude of the output signals indicates a mechanical resonant frequency of the temperature sensing device. Then, when a local ambient temperature changes at operation 810, the mechanical resonant frequency of the temperature sensing device changes because of induced thermomechanical stresses (e.g., a beam structure expands or contracts in response to a change in temperature). At operation 812, a change in resonant frequency is measured using the electrical signals as described above (e.g., operations 808, 810) and the change in resonant frequency is used to determine the corresponding temperature change.

The components (e.g., structures, base structures, cavities, etc.) illustrated in various figures of the present design generally have rectangular shapes though it is appreciated that these components can have any type of shape or configuration.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more piezoelectric vibrating devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 9:
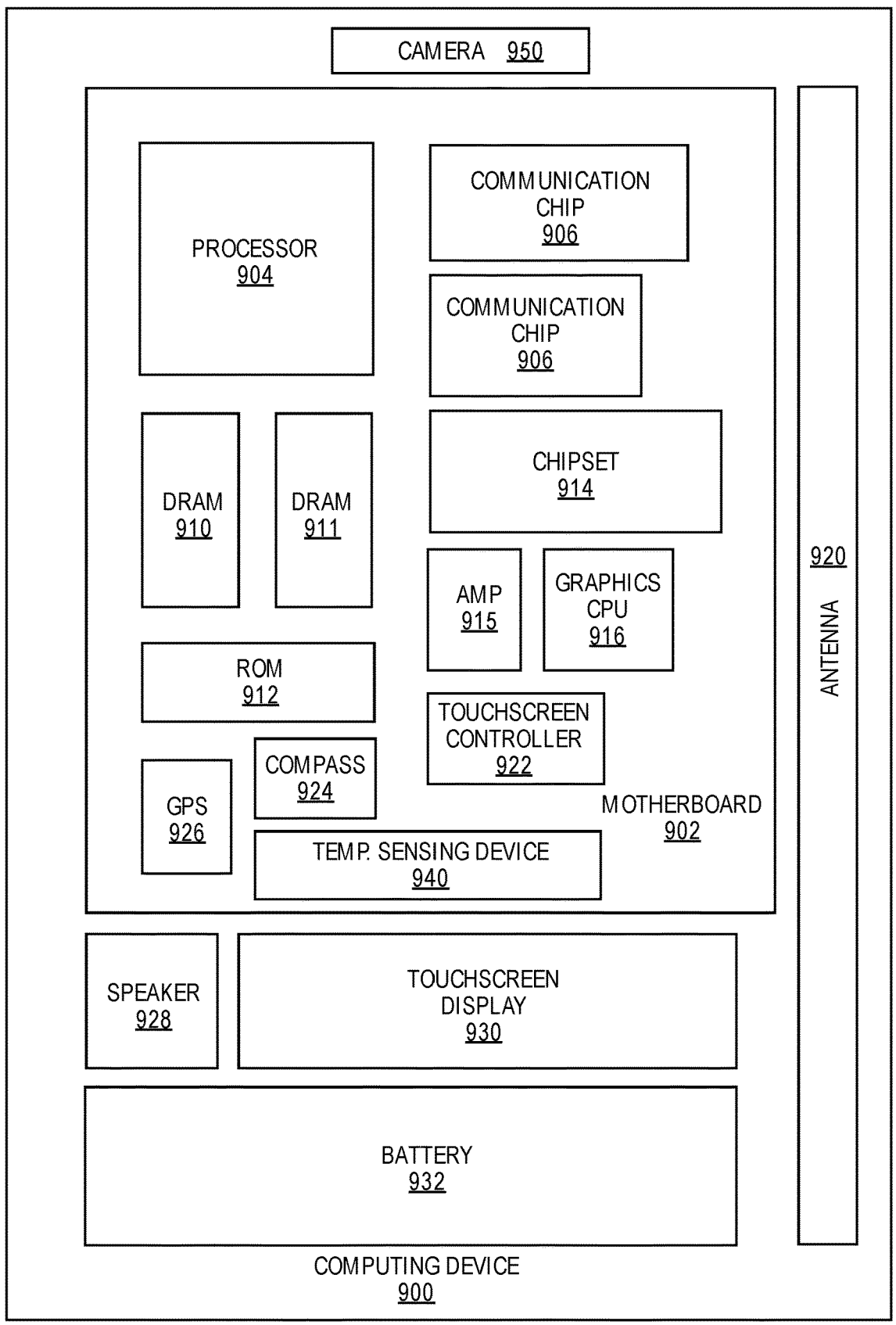
FIG. 9 illustrates a computing device 900 in accordance with one embodiment.

FIG. 9 illustrates a computing device 900 in accordance with one embodiment of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna 920, a display, a touchscreen display 930, a touchscreen controller 922, a battery 932, an audio codec, a video codec, a power amplifier 915, a global positioning system (GPS) device 926, a compass 924, a piezoelectric device 940 (e.g., a piezoelectric temperature sensing device), a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig and Bluetooth and a second communication chip 906 may be dedicated to longer range wireless communications such as GPS, EDGE, GPRS, CDMA, WiMAX, LTE, Ev-DO, 5G, and others.

The processor 904 of the computing device 900 includes an integrated circuit die packaged within the processor 904. In some implementations of the invention, the processor package includes one or more devices, such as temperature sensing devices in accordance with implementations of embodiments of the invention. The term "processor" may refer to any device or portion of a device that processes electronic data from registers and/or memory to transform that electronic data into other electronic data that may be stored in registers and/or memory. The communication chip 906 also includes an integrated circuit die packaged within the communication chip 906. The following examples pertain to further embodiments.

Example 1 is a temperature sensing device comprising a base structure that is positioned in proximity to a cavity of an organic substrate, an input transducer coupled to the base structure, and an output transducer coupled to the base structure. The input transducer has a first piezoelectric material to generate vibrations which are transmitted on the base structure in response to input signals being applied to the input transducer. The output transducer has a second piezoelectric material to receive the vibrations and to generate output signals which are used to determine a change in ambient temperature.

In example 2, the subject matter of example 1 can optionally include the temperature sensing device being integrated with the organic substrate which is fabricated using panel level processing. In example 3, the subject matter of any of examples 1-2 can optionally include the base structure being positioned above the cavity of the organic substrate to allow vibrations to be transmitted from the input transducer to the output transducer.

In example 4, the subject matter of any of examples 1-3 can optionally include the output signals being used to determine a mechanical resonant frequency of the temperature sensing device by applying input signals with different frequencies and monitoring a maximum amplitude of the output signals.

In example 5, the subject matter of any of examples 1-4 can optionally include a change in ambient temperature causing thermomechanical stresses in the base structure and this causes a change in the mechanical resonant frequency of the temperature sensing device.

In example 6, the subject matter of any of examples 1-5 can optionally include the input transducer including a first electrode disposed on the piezoelectric material and a first region of the base structure in contact with the first piezoelectric material and this first region acting as a second electrode of the input transducer. The output transducer includes a first electrode disposed on the second piezoelectric material and a second region of the base structure in contact with the second piezoelectric material and this second region acting as a second electrode of the output transducer.

In example 7, the subject matter of any of examples 1-6 can optionally include the input transducer having a first electrode disposed on the first piezoelectric material which is disposed on a second electrode of the input transducer.

In example 8, the subject matter of any of examples 1-7 can optionally include an insulating layer to electrically decouple the second electrode and the base structure.

In example 9, the subject matter of any of examples 1-8 can optionally include the base structure comprising a meandering beam portion to increase a length of the base structure.

In example 10, the subject matter of any of examples 1-9 can optionally include the base structure comprising first and second tapered portions to increase an area of the base structure.

Example 11 is a package substrate comprising a plurality of organic dielectric layers and a plurality of conductive layers to form the package substrate, a cavity formed in the package substrate, and a piezoelectric temperature sensing device integrated within the package substrate. The piezoelectric temperature sensing device includes a base structure that is positioned in proximity to the cavity, an input transducer integrated with the base structure, and an output transducer integrated with the base structure. The input transducer has a first piezoelectric material to generate vibrations in response to input signals being applied to the input transducer and the output transducer has a second piezoelectric material to receive the vibrations and to generate output signals which are used to determine a change in ambient temperature.

In example 12, the subject matter of example 11 can optionally include the temperature sensing device being integrated with the organic package substrate which is fabricated using panel level processing.

In example 13, the subject matter of any of examples 11-12 can optionally include the base structure being positioned above the cavity to allow vibrations to be transmitted from the input transducer to the output transducer.

In example 14, the subject matter of any of examples 11-13 can optionally include the output signals that are used to determine a mechanical resonant frequency of the temperature sensing device by applying input signals with different frequencies and monitoring a maximum amplitude of the output signals.

In example 15, the subject matter of any of examples 11-14 can optionally include a change in ambient temperature causing thermomechanical stresses in the base structure and this causes a change in the mechanical resonant frequency.

In example 16, the subject matter of any of examples 11-15 can optionally include the input transducer having an input electrode disposed on the first piezoelectric material which is disposed on the base structure. The output transducer includes the base structure which is disposed on the second piezoelectric material which is disposed on an output electrode of the output transducer.

In example 17, the subject matter of any of examples 11-16 can optionally include the base structure that functions as a common electrode for the input transducer and the output transducer.

Example 18 is a computing device comprising at least one processor to process data and a package substrate coupled to the at least one processor. The package substrate including a plurality of organic dielectric layers and a plurality of conductive layers to form the package substrate which includes a piezoelectric temperature sensing device having a base structure that is positioned in proximity to a cavity of the package substrate, an input transducer coupled to the base structure, and an output transducer coupled to the base structure. The input transducer has a first piezoelectric material to generate vibrations which are transmitted on the base structure in response to input signals being applied to the input transducer and the output transducer has a second piezoelectric material to receive the vibrations and to generate output signals which are used to determine a change in ambient temperature.

In example 19, the subject matter of example 18 can optionally include the temperature sensing device being integrated with the package substrate which is fabricated using panel level processing.

In example 20, the subject matter of any of examples 18-19 can optionally include the output signals being used to determine a mechanical resonant frequency of the temperature sensing device by applying input signals with different frequencies and monitoring a maximum amplitude of the output signals.

In example 21, the subject matter of any of examples 18-20 can optionally include a change in ambient temperature that causes thermomechanical stresses in the base structure and this causes a change in the mechanical resonant frequency of the temperature sensing device.

In example 22, the subject matter of any of examples 18-21 can optionally include a printed circuit board that is coupled to the package substrate.

The invention claimed is:
1. A temperature sensing device, comprising:
a base structure that is positioned in proximity to a cavity of an organic substrate;

an input transducer coupled to the base structure, the input transducer having a first piezoelectric material to generate vibrations which are transmitted on the base structure in response to input signals being applied to the input transducer; and an output transducer coupled to the base structure, wherein the output transducer has a second piezoelectric material to receive the vibrations from the base structure and to generate output signals which are used to determine a change in ambient temperature.

2. The temperature sensing device of claim 1, wherein the input transducer includes a first electrode disposed on the piezoelectric material and a first region of the base structure in contact with the first piezoelectric material and this first region acting as a second electrode of the input transducer, wherein the output transducer includes a first electrode disposed on the second piezoelectric material and a second region of the base structure in contact with the second piezoelectric material and this second region acting as a second electrode of the output transducer.

3. The temperature sensing device of claim 1, wherein the base structure comprises a meandering beam portion to increase a length of the base structure.

4. The temperature sensing device of claim 1, wherein the base structure comprises first and second tapered portions to increase an area of the base structure.

5. The temperature sensing device of claim 1, wherein the temperature sensing device is integrated with the organic substrate which is fabricated using panel level processing.

6. The temperature sensing device of claim 5, wherein the base structure is positioned above the cavity of the organic substrate to allow vibrations to be transmitted from the input transducer to the output transducer.

7. The temperature sensing device of claim 1, wherein the output signals are used to determine a mechanical resonant frequency of the temperature sensing device by applying input signals with different frequencies and monitoring a maximum amplitude of the output signals.

8. The temperature sensing device of claim 7, wherein a change in ambient temperature causes thermomechanical stresses in the base structure and this causes a change in the mechanical resonant frequency of the temperature sensing device.

9. The temperature sensing device of claim 1, wherein the input transducer includes a first electrode disposed on the first piezoelectric material which is disposed on a second electrode of the input transducer.

10. The temperature sensing device of claim 9, further comprising: an insulating layer to electrically decouple the second electrode and the base structure.

11. A package substrate comprising:
a plurality of organic dielectric layers and a plurality of conductive layers to form the package substrate;
a cavity formed in the package substrate; and
a piezoelectric temperature sensing device integrated within the package substrate, the piezoelectric temperature sensing device including a base structure that is positioned in proximity to the cavity, an input transducer integrated with the base structure, and an output transducer integrated with the base structure, wherein the input transducer has a first piezoelectric material to generate vibrations in response to input signals being applied to the input transducer and the output transducer has a second piezoelectric material to receive the vibrations from the base structure and to generate output signals which are used to determine a change in ambient temperature.

12. The package substrate of claim 11, wherein the temperature sensing device is integrated with the organic package substrate which is fabricated using panel level processing.

13. The package substrate of claim 12, wherein the base structure is positioned above the cavity to allow vibrations to be transmitted from the input transducer to the output transducer.

14. The package substrate of claim 11, wherein the output signals are used to determine a mechanical resonant frequency of the temperature sensing device by applying input signals with different frequencies and monitoring a maximum amplitude of the output signals.

15. The package substrate of claim 14, wherein a change in ambient temperature causes thermomechanical stresses in the base structure and this causes a change in the mechanical resonant frequency.

16. The package substrate of claim 11, wherein the input transducer includes an input electrode disposed on the first piezoelectric material which is disposed on the base structure, wherein the output transducer includes the base structure which is disposed on the second piezoelectric material which is disposed on an output electrode of the output transducer.

17. The package substrate of claim 16, wherein the base structure functions as a common electrode for the input transducer and the output transducer.

18. A computing device comprising:
at least one processor to process data; and
a package substrate coupled to the at least one processor, the package substrate including a plurality of organic dielectric layers and a plurality of conductive layers to form the package substrate which includes a piezoelectric temperature sensing device having a base structure that is positioned in proximity to a cavity of the package substrate, an input transducer coupled to the base structure, and an output transducer coupled to the base structure, wherein the input transducer has a first piezoelectric material to generate vibrations which are transmitted on the base structure in response to input signals being applied to the input transducer and the output transducer has a second piezoelectric material to receive the vibrations from the base structure and to generate output signals which are used to determine a change in ambient temperature.

19. The computing device of claim 18, wherein the temperature sensing device is integrated with the package substrate which is fabricated using panel level processing.

20. The computing device of claim 18, further comprising:
a printed circuit board coupled to the package substrate.

21. The computing device of claim 18, wherein the output signals are used to determine a mechanical resonant frequency of the temperature sensing device by applying input signals with different frequencies and monitoring a maximum amplitude of the output signals.

22. The computing device of claim 21, wherein a change in ambient temperature causes thermomechanical stresses in the base structure and this causes a change in the mechanical resonant frequency of the temperature sensing device.

* * * * *